United States Patent
Lee et al.

(10) Patent No.: US 10,504,788 B2
(45) Date of Patent: Dec. 10, 2019

(54) METHOD OF ADJUSTING SIGNAL TO NOISE RATIO OF SRAM AND INVERTOR STRUCTURE

(71) Applicant: UNITED MICROELECTRONICS CORP., Hsin-Chu (TW)

(72) Inventors: Wei-Chi Lee, Tainan (TW); Han-Tsun Wang, Tainan (TW); Chang-Hung Chen, Tainan (TW); Po-Yu Yang, Hsinchu (TW); Mei-Ying Fan, Hsinchu County (TW); Mu-Kai Tsai, Hsinchu County (TW); Guan-Shyan Lin, Taipei (TW); Tsz-Hui Kuo, Hsinchu (TW); Cheng-Hsiung Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/297,702

(22) Filed: Mar. 10, 2019

(65) Prior Publication Data

US 2019/0318964 A1  Oct. 17, 2019

Related U.S. Application Data

(62) Division of application No. 15/976,848, filed on May 10, 2018, now Pat. No. 10,276,446.

(30) Foreign Application Priority Data

Apr. 13, 2018 (TW) .............................. 107112656 A (51) Int. Cl.
*H01L 27/088* (2006.01)
*H01L 27/11* (2006.01)
*H01L 21/8234* (2006.01)

(52) U.S. Cl.
CPC ........... *H01L 21/823456* (2013.01); *H01L 21/823431* (2013.01); *H01L 27/0886* (2013.01); *H01L 27/1104* (2013.01)

(58) Field of Classification Search
CPC ..... H01L 21/823456; H01L 21/823431; H01L 27/0886; H01L 27/1104
(Continued)

(56) References Cited

U.S. PATENT DOCUMENTS

2016/0172360 A1   6/2016  Shimbo
2016/0372476 A1*  12/2016 Hung ................. H01L 29/7851

OTHER PUBLICATIONS

Chen, IEEE Xplore, Publication Year: 2015, pp. 110-115 title: Compact modeling solution of layout dependent effect for FinFET technology, Mar. 23, 2015.

* cited by examiner

*Primary Examiner* — Tong-Ho Kim
(74) *Attorney, Agent, or Firm* — Winston Hsu (57) ABSTRACT

An inverter structure includes a first fin structure and a second fin structure respectively disposed within a P-type transistor region and an N-type transistor region on a substrate. A gate line is disposed on the substrate. A first end of the gate line is within the P-type transistor region, and a second end of the gate line is within the N-type transistor region. Two dummy gate lines are disposed at two sides of the gate line. Each dummy gate line has a third end within the P-type transistor region, and a fourth end within the N-type transistor region. A distance between the first end and the first fin structure is greater than a distance between the third end and the first fin structure. The distance between the second end and the second fin structure is smaller than a distance between the fourth end and the second fin structure.

9 Claims, 5 Drawing Sheets

(58) Field of Classification Search
USPC .......................................................... 257/401
See application file for complete search history.

METHOD OF ADJUSTING SIGNAL TO NOISE RATIO OF SRAM AND INVERTOR STRUCTURE

CROSS REFERENCE TO RELATED APPLICATIONS

This patent application is a divisional application of and claims priority to U.S. patent application Ser. No. 15/976,848, filed on May 10, 2018, and entitled "METHOD OF ADJUSTING SIGNAL TO NOISE RATIO OF SRAM AND INVERTOR STRUCTURE" the entire contents of which are incorporated herein by reference.

BACKGROUND OF THE INVENTION

1. Field of the Invention

The present invention relates to a method of adjusting a signal to noise ratio (SNR) of a static random access memory (SRAM) and an inverter structure, and more particularly to a method of adjusting the SNR and efficiency of the inverter structure by altering a gate length.

2. Description of the Prior Art

A static random access memory (SRAM) cell comprises a logic circuit connected to a static random access memory. An SRAM is a kind of volatile memory cell, which means it preserves data only while power is continuously applied. An SRAM is built of cross-coupled inverters that store data while power remains applied, unlike a dynamic random access memory (DRAM) which needs to be periodically refreshed. SRAM is also used in computer systems as a cache memory. As the speed of electronic elements increases, however, the SRAM needs to achieve a higher performance.

SUMMARY OF THE INVENTION

Accordingly, it is a primary object of the present invention to provide an SRAM with high performance. According to one embodiment of the present invention, an inverter structure includes a substrate divided into a P-type transistor region and an N-type transistor region. A first fin structure is disposed within the P-type transistor region. A second fin structure is disposed within the N-type transistor region, wherein the first fin structure and the second fin structure are parallel. A gate line is disposed within the P-type transistor region and the N-type transistor region, and the gate line is perpendicular to the first fin structure, wherein the gate line includes a first end within the P-type transistor region and a second end within the N-type transistor region. Two first dummy gate lines are respectively disposed at two sides of the gate line, the two first dummy gate lines being perpendicular to the first fin structure, wherein each of the first dummy gate lines includes a third end within the P-type transistor region and a fourth end within the N-type transistor region. A first distance between the first end and the first fin structure is greater than a third distance between the third end and the first fin structure, and a second distance between the second end and the second fin structure is smaller than a fourth distance between the fourth end and the second fin structure.

According to another embodiment of the present invention, a method of adjusting an SNR of an SRAM includes providing a substrate. A first long fin structure and a second long fin structure are disposed on the substrate, and a first short fin structure and a second short fin structure are disposed on the substrate and between the first long fin structure and the second long fin structure. A first gate line crosses the first long fin structure and the first short fin structure. The second long fin structure and the second gate line crosses the first long fin structure, the second short fin structure and the second long fin structure, wherein the first long fin structure comprises a first side and a second side, the second side faces the first short fin structure, the first side is opposite to the second side, the second long fin structure comprises a third side and the fourth side, the fourth side faces the second short fin structure, and the third side is opposite to the fourth side. Later, a gate line cutting step is performed, wherein the gate line cutting step includes removing the second gate line between the first long fin structure and the second short fin structure by a first length, removing the first gate line between the second long fin structure and the first short fin structure by the first length, removing the first gate line at the first side of the first long fin structure by a second length, and removing the second gate line at the third side of the second long fin structure by the second length. An SNR of an SRAM which has the first length greater than the second length is greater than an SNR of an SRAM which has the first length equal to the second length.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 depict a method of fabricating an SRAM according to a first preferred embodiment of the present invention, wherein:

FIG. 3 to FIG. 4 depict a method of adjusting an SNR of an SRAM according to a second preferred embodiment of the present invention, wherein:

FIG. 6 to FIG. 7 depict a method of adjusting an SNR of an SRAM according to a third preferred embodiment of the present invention wherein:

DETAILED DESCRIPTION

Figure 1:
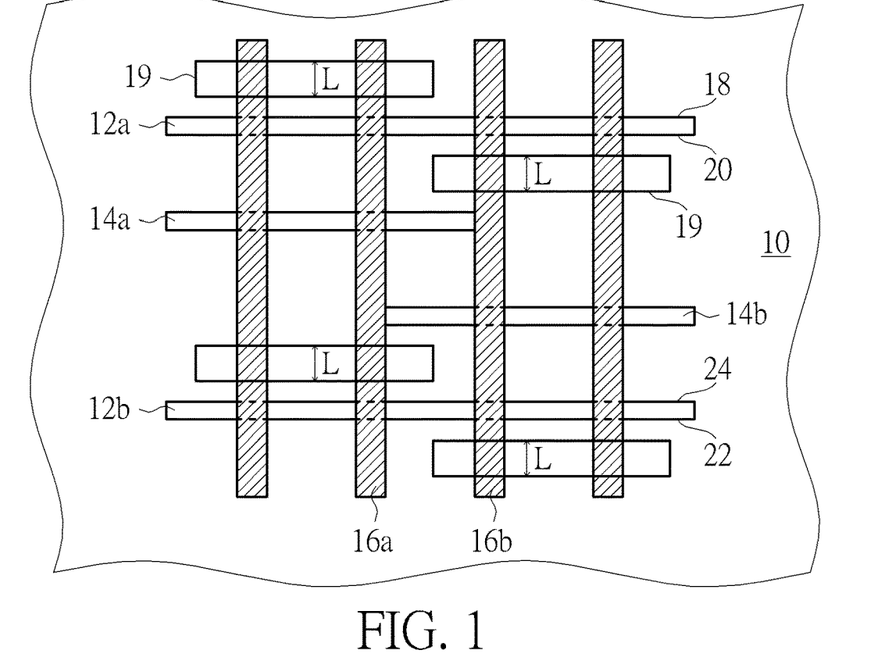
Figure 2:
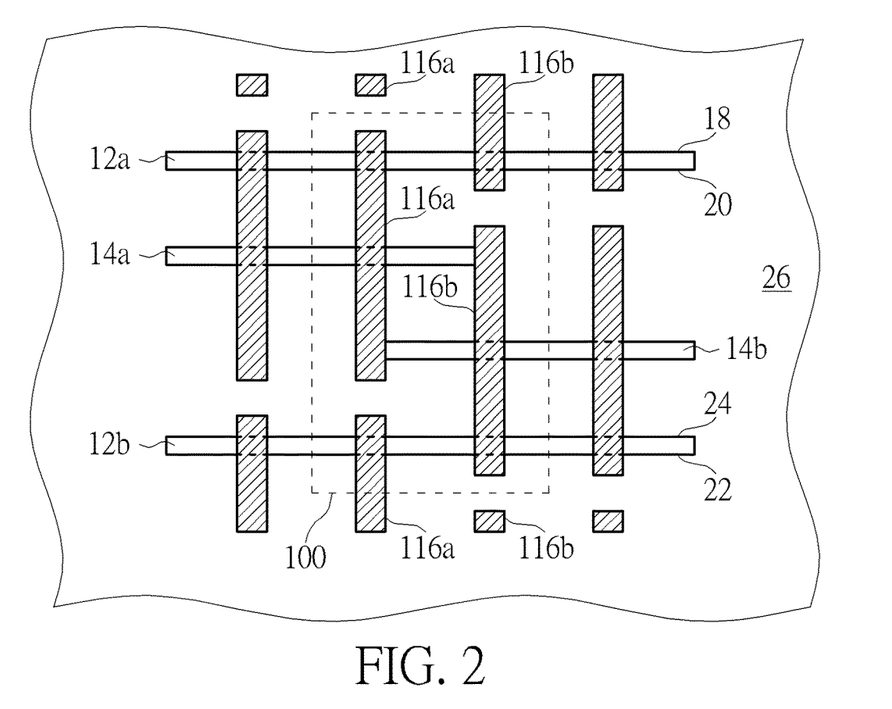
FIG. 2 is a fabricating stage following FIG. 1.

FIG. 1 to FIG. 2 depict a method of fabricating an SRAM according to a first preferred embodiment of the present invention.

As shown in FIG. 1, a substrate 10 is provided. A first long fin structure 12a, a second long fin structure 12b, a first short fin structure 14a, and a second short fin structure 14b are disposed on the substrate 10. The first short fin structure 14a and the second short fin structure 14b are disposed between the first long fin structure 12a and the second long fin structure 12b. The first long fin structure 12a, the second long fin structure 12b, the first short fin structure 14a and the second short fin structure 14b are parallel. Furthermore, a first gate line 16a crosses the first long fin structure 12a, the first short fin structure 14a and the second long fin structure 12b. A second gate line 16b crosses the first long fin structure 12a, the second short fin structure 14b and the second long fin structure 12b. The first gate line 16a and the second gate line 16b are parallel. It is noteworthy that the first short fin 14a does not overlap or cross the second gate line 16b, and the second short fin structure 14b does not overlap or cross the first gate line 16a. In detail, the first long fin structure 12a includes a first side 18 and a second side 20. The second side 20 faces the first short fin structure 14a. The first side 18 is opposite to the second side 20. The second long fin structure 12b includes a third side 22 and a fourth side 24. The fourth side 24 faces the second short fin structure 14b. The third side 22 is opposite to the fourth side 24. The substrate 10 may be a bulk silicon substrate, a germanium substrate, a gallium arsenide substrate, a silicon germanium substrate, an indium phosphide substrate, a gallium nitride substrate or a silicon carbide substrate. The first long fin structure 12a, the second long fin structure 12b, the first short fin structure 14a and the second short fin structure 14b may extend from the substrate 10 and are made of the same material as the substrate 10. The first gate line 16a and the second gate line 16b may include a conductive polysilicon and a gate dielectric layer.

Then, a gate line cutting step is performed by the following steps. A basic length L is provided. The basic length L, the first gate line 16a and the second gate line 16b are parallel. The second gate line 16b between the first long fin structure 12a and the second short fin structure 14b, the first gate line 16a between the second long fin structure 12b and the first short fin structure 14a, the first gate line 16a at the first side 18 of the first long fin structure 12a and the second gate line 16b at the third side 22 of the second long fin structure 12b are removed by the basic length L, i.e. the first gate line 16a and the second gate line 16b are respectively removed by two discontinuous basic lengths L. As shown in FIG. 2, after the gate line cutting step, the first gate line 16a is divided into three first gate line segments 116a, and the second gate line 16b is divided into three second gate line segments 116b. Next, a dielectric layer 26 is formed to encapsulate an end of each of the first gate line segments 116a, and an end of each of the second gate line segments 116b.

The gate line cutting step may be performed by a lithographic process and an etching process. For example, a photoresist (not shown) is formed to cover the substrate 10, the first long fin structure 12a, the second long fin structure 12b, the first short fin structure 14a, the second short fin structure 14b, the first gate line 16a and the second gate line 16b. Later, a photo mask is used to pattern the photoresist and define a region 19. The region 19 includes the position to be removed from the first gate line 16a and the second gate line 16b. Subsequently, the basic length L of the first gate line 16a and the basic length L of the second gate line 16b are removed simultaneously by an etching process to form numerous first gate line segments 116a and numerous second gate line segments 116b.

Continue to refer to FIG. 2. The first gate line segments 116a, the second gate line segments 116b, the first long fin structure 12a, the second long fin structure 12b, the first short fin structure 14a and the second short fin structure 14b together form an SRAM structure 100. The SRAM structure 100 has an initial signal-to-noise ratio (SNR), and an initial read current.

Figure 3:
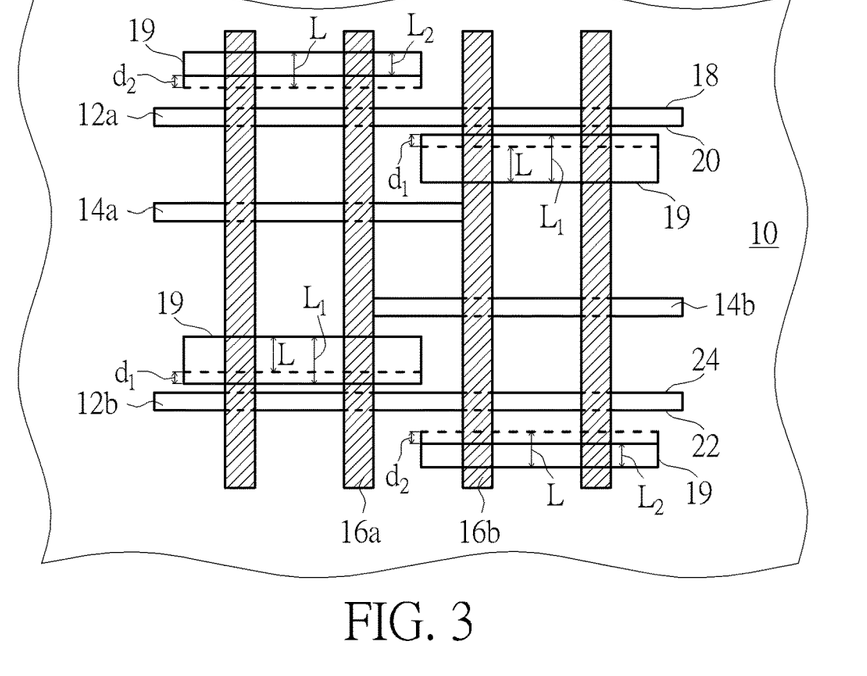
Figure 4:
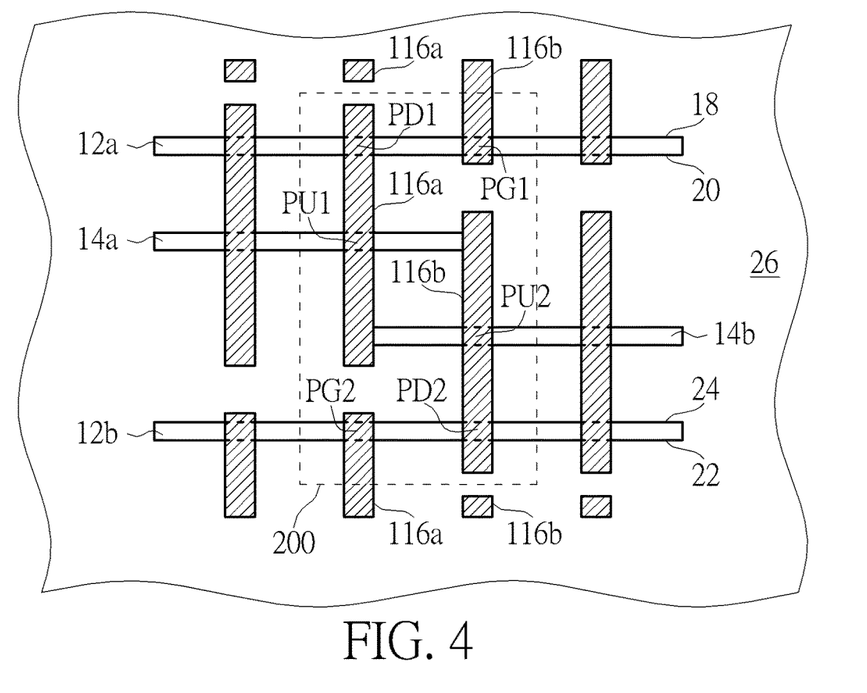
FIG. 4 is an adjusting method following FIG. 3.

FIG. 3 to FIG. 4 depict a method of adjusting an SNR of an SRAM according to a second preferred embodiment, wherein elements which substantially have the same position and function as those in the first preferred embodiment are denoted by the same reference numerals.

As shown in FIG. 3, a substrate 10, a first long fin structure 12a, a second long fin structure 12b, a first short fin structure 14a, a second short fin structure 14b, a first gate line 16a and a second gate line 16b are provided, wherein details of the materials and positions of the substrate 10, the first long fin structure 12a, the second long fin structure 12b, the first short fin structure 14a, the second short fin structure 14b, the first gate line 16a and the second gate line 16b can be known by referring to the first preferred embodiment.

Next, a gate line cutting step is performed as follows. A first length $L_1$ and a second length $L_2$ are provided. The first length $L_1$ is greater than the basic length L in the first preferred embodiment, and the second length $L_2$ is smaller than the basic length L in the first preferred embodiment, i.e. the first length $L_1$ is greater than the second length $L_2$. The first length $L_1$, the second length $L_2$ and the basic length L are parallel. The first length $L_1$ on the first gate line 16a equals the basic length L plus a first adjusted length $d_1$ in a direction toward the second long fin structure 12b. The first length $L_1$ on the second gate line 16b equals the basic length L plus the first adjusted length $d_1$ in a direction toward the first long fin structure 12a. A second length $L_2$ on the first gate line 16a equals the basic length L minus a second adjusted length $d_2$ in a direction away from the third side 22. The second length $L_2$ on the second gate line 16b equals the basic length L minus the second adjusted length $d_2$ in a direction away from the first side 18. The first adjusted length $d_1$ may be equal to or not equal to the second adjusted length $d_2$. As in the first preferred embodiment, the gate line cutting step may be performed by a lithographic process and an etching process.

During the gate line cutting step, the first gate line 16a between the second long fin structure 12b and the first short fin structure 14a, near the second short fin structure 14b and the second long fin structure 12b, and away from the first short fin structure 14a, is removed by the first length $L_1$. The second gate line 16b between the first long fin structure 12a and the second short fin structure 14b, near the first long fin structure 12a and the first short fin structure 14a, and away from the second short fin structure 14b, is removed by the first length $L_1$. The first gate line 16a at the first side 18 of the first long fin structure 12a is removed by the second length $L_2$. The second gate line 16b at the third side 22 of the second long fin structure 12b is removed by the second length $L_2$.

As shown in FIG. 4, after the gate line cutting step, the first gate line 16a is divided into three first gate line segments 116a, and the second gate line 16b is divided into three second gate line segments 116b. At this point, two first gate line segments 116a, two second gate line segments 116b, the first long fin structure 12a, the second long fin structure 12b, the first short fin structure 14a and the second short fin structure 14b form an SRAM 200. Next, a dielectric layer 26 is formed to encapsulate an end of each of the first gate line segments 116a, and an end of each of the second gate line segments 116b. The dielectric layer 26 may be silicon nitride, silicon oxide or other insulating materials.

An overlapped region of the first long fin structure 12a and one of the first gate line segments 116a forms a first pull-down transistor PD1, an overlapped region of the first long fin structure 12a and one of the second gate line segments 116b forms a first pass gate transistor PG1, an overlapped region of the first short fin structure 14a and one of the first gate line segments 116a forms a first pull-up transistor PU1, an overlapped region of the second short fin structure 14b and one of the second gate line segments 116b forms a second pull-up transistor PU2, an overlapped region of the second long fin structure 12b and one of the first gate line segments 116a forms a second pass gate transistor PG2, and an overlapped region of the second long fin structure 12b and one of the second gate line segments 116b forms a second pull-down transistor PD2.

The different between the first preferred embodiment and the second preferred embodiment is that the gate lines are removed by different lengths. Furthermore, the gate line segments within the first pass gate transistor PG1 and the second pass gate transistor PG2 in the second preferred embodiment is shorter than the gate line segments at the same position in the first preferred embodiment. The gate line segments within the first pull-down transistor PD1 and the second pull-down transistor PD2 in the second preferred embodiment is longer than the gate line segments at the same position in the first preferred embodiment. Because the dielectric layer 26 contains stress, stress can be respectively transferred from the end of the first gate line segments 116a and the end of the second gate line segments 116b to the first gate line segments 116a and the second gate line segments 116b. As a result, the stresses in the first pass gate transistor PG1, the second pass gate transistor PG2, the first pull-down transistor PD1 and the second pull-down transistor PD2 in the second preferred embodiment are different from those in the first preferred embodiment. Therefore, the threshold voltage of each of the transistors in the second preferred embodiment is different from that in the first preferred embodiment. In the end, the SNR of the SRAM 200 is greater than the SRN of the SRAM 100.

Figure 5:
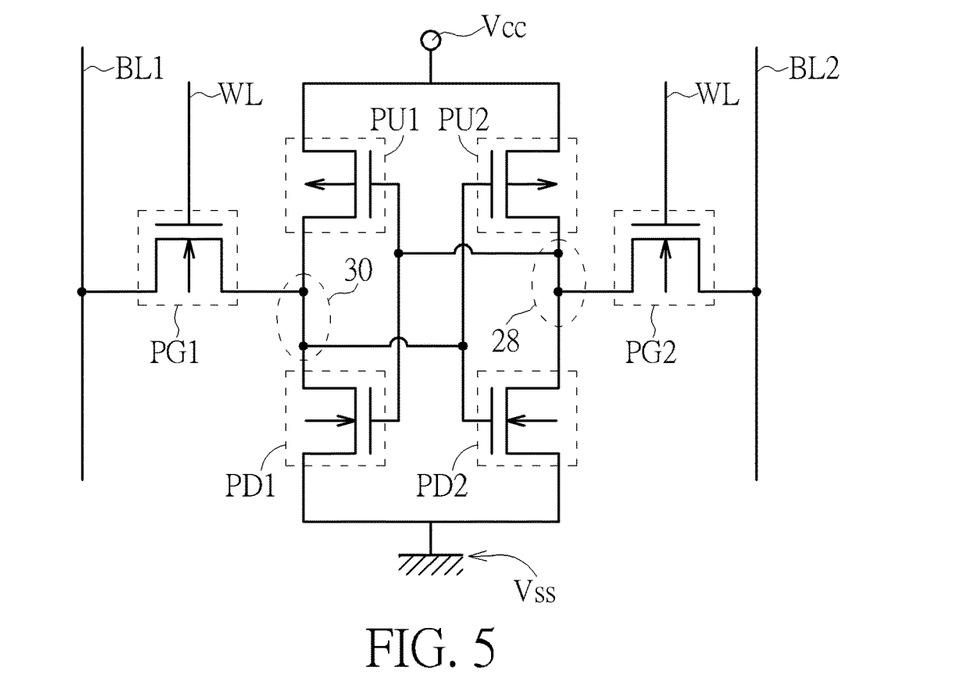
FIG. 5 is an equivalent circuit diagram of an SRAM in FIG. 4 of the present invention.

FIG. 5 is an equivalent circuit diagram of an SRAM in FIG. 4 of the present invention. As shown in FIG. 4 and FIG. 5, a first pull-up transistor PU1, a second pull-up transistor PU2, a first pull-down transistor PD1 and a second pull-down transistor PD2 constitute a latch circuit that stores data in the storage nodes 28 or 30. The first pull-up transistor PU1 and the first pull-down transistor PD 1 form an inverter, and respectively electrically connect to a voltage source (voltage node) Vcc and a voltage source (voltage node) Vss. The second pull-up transistor PU2 and the second pull-down transistor PD2 form another inverter, and respectively electrically connect to the voltage source Vcc and the voltage source Vss. The aforesaid inverters couple to each other to store data.

Preferably, the first pull-up transistor PU1, and the second pull-up transistor PU2 are composed of p-type metal oxide semiconductor (PMOS) transistors; the first pull-down transistor PD1, the second pull-down transistor PD2, the first pass gate devices PG1 and the second pass gate devices PG2 are composed of n-type metal oxide semiconductor (NMOS) transistors, but the invention is not limited thereto. The storage node 30 electrically connects to a source of the first pass gate transistor PG1, and the storage node 28 electrically connects to a source of the second pass gate transistor PG2. The gates of the first pass gate transistor PG1 and the second pass gate transistor PG2 are respectively coupled to a word line (WL), and the drain of the first pass gate device PG1 and the second pass gate device PG2 are respectively coupled to a bit line BL1 and a bit line BL2.

Figure 6:
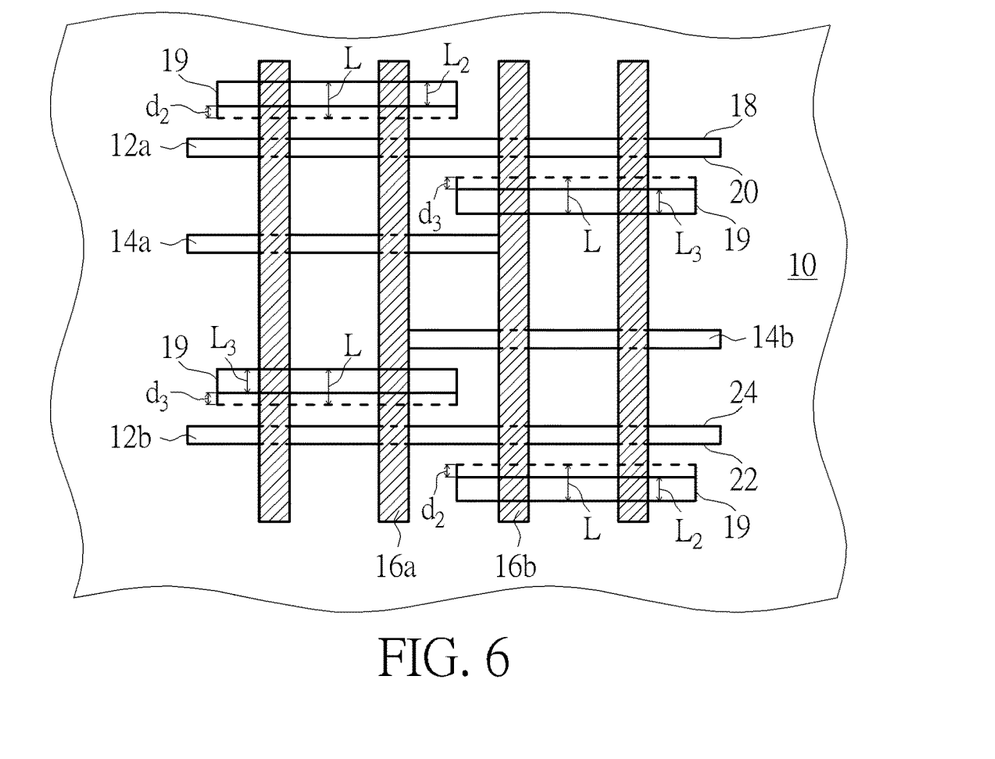
Figure 7:
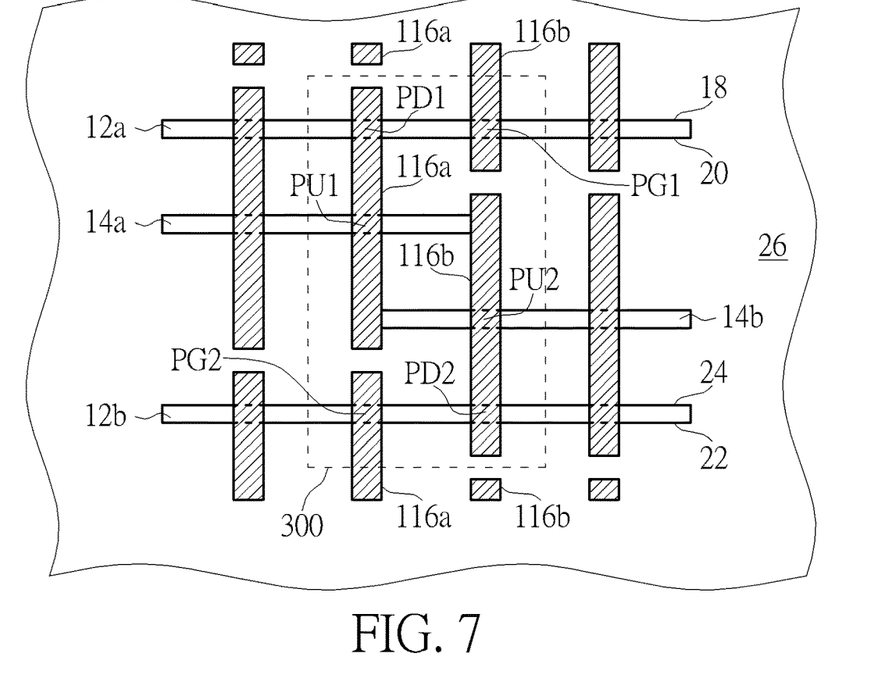
FIG. 7 is an adjusting method following FIG. 6.

FIG. 6 to FIG. 7 depict a method of adjusting an SNR of an SRAM according to a third preferred embodiment, wherein elements which substantially have the same position and function as those in the first preferred embodiment are denoted by the same reference numerals. In the third preferred embodiment, a third length $L_3$ replaces the first length $L_1$ in the second preferred embodiment. Furthermore, in the third preferred embodiment, the second length $L_2$ is still used in the same position as in the second preferred embodiment. In detail, the third length $L_3$ equals the basic length L minus a third adjusted length $d_3$ in a direction away from the first long fin structure 12a and the second long fin structure 12b. In other words, the third length $L_3$ is shorter than the basic length L. An SRAM formed by the method in the third preferred embodiment has a read current greater than the initial read current of the SRAM 100.

Figure 8:
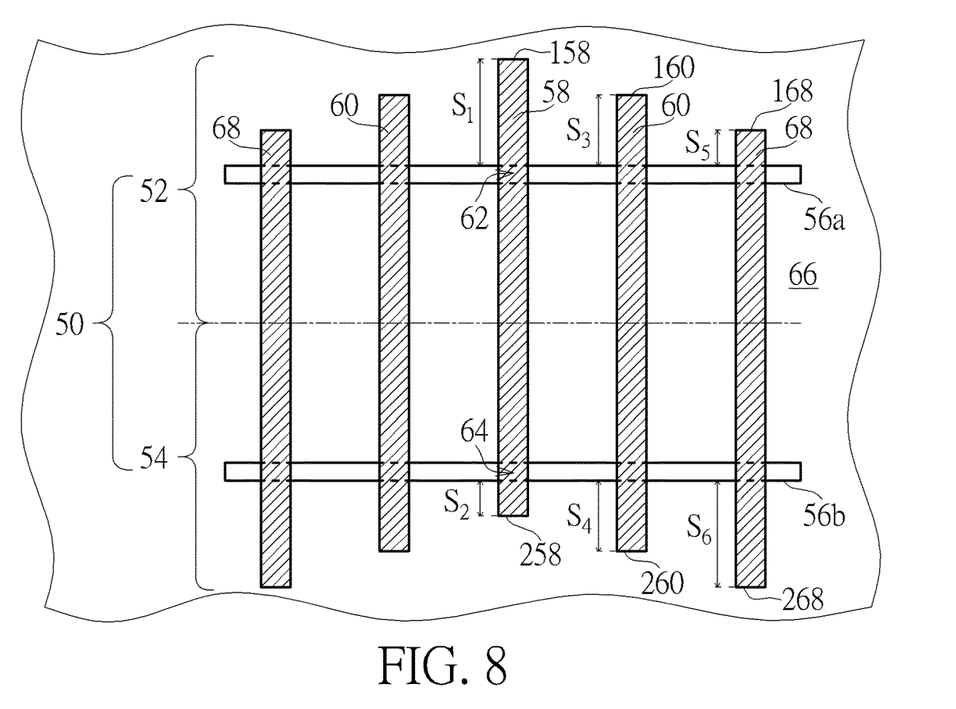
FIG. 8 depicts an inverter structure according to a fourth preferred embodiment of the present invention.

FIG. 8 depicts an inverter structure according to a fourth preferred embodiment of the present invention. The inverter structure can be used in the SRAM. The inverter structure includes a substrate 50. The substrate includes a P-type transistor region 52 and an N-type transistor region 54. A first fin structure 56a is disposed within the P-type transistor region 52. A second fin structure 56b is disposed within the N-type transistor region 54. The first fin structure 56a and the second fin structure 56b are parallel. A gate line 58 is disposed within the P-type transistor region 52 and the N-type transistor region 54, wherein the gate line 58 is perpendicular to the first fin structure 56a and the second fin structure 56b. The gate line 58 includes a first end 158 within the P-type transistor region 52 and a second end 258 within the N-type transistor region 54. Two first dummy gate lines 60 are respectively disposed at two sides of the gate line 58, and the first dummy gate lines 60 are perpendicular to the first fin structure 56a and the second fin structure 56b. Each of the first dummy gate lines 60 includes a third end 160 within the P-type transistor region 52 and a fourth end 260 within the N-type transistor region 54. It is noteworthy that a first distance $S_1$ between the first end 158 and the first fin structure 56a is greater than a third distance $S_3$ between the third end 160 and the first fin structure 56a, and a second distance $S_2$ between the second end 258 and the second fin structure 56b is smaller than a fourth distance $S_4$ between the fourth end 260 and the second fin structure 56b. The first distance $S_1$, the second distance $S_2$, the third distance $S_3$, the fourth distance $S_4$, and the gate line 58 are parallel.

An overlapped region of the gate line 58 and the first fin structure 56a forms a P-type gate. P-type source/drain regions (not shown) are respectively disposed in the first fin structure 56a at two sides of the P-type gate. The P-type gate, the P-type source/drain doped regions and the first fin structure 56a form a P-type transistor 62, an overlapped region of the gate line 58 and the second fin structure 56b forms an N-type gate, and two N-type source/drain doped regions are respectively disposed in the second fin structure 56b at two sides of the N-type gate. The N-type gate, the N-type source/drain doped regions and the second fin structure 56b form an N-type transistor 64. The P-type transistor 62 and the N-type transistor 64 form an inverter.

Moreover, a dielectric layer 66 encapsulates the first end 158, the second end 258, the third end 160 and the fourth end 260. The dielectric layer 66 can be silicon nitride, silicon oxide or other insulating materials. Moreover, the dielectric layer 66 contains stress, meaning the stress in the dielectric layer 66 can be applied to the first end 158, the second end 258, the third end 160 and the fourth end 260 to change the stress in the fin structure directly under the N-type gate or P-type gate. The stress in the dielectric layer 66 is tensile stress. Therefore, in the P-type transistor 62, the farther the first end 158 is from the first fin structure 56a of the P-type transistor 62, the better the efficiency of the P-type transistor 62 can become. In the N-type transistor 64, the closer the second end 258 is to the second fin structure 56*b* of the N-type transistor 64, the better the efficiency of the N-type transistor 64 can become.

According to another preferred embodiment of the present invention, the inverter structure may include two second dummy gate lines 68. Each of the second dummy gate lines 68 is respectively disposed at one side of each of the two first dummy gate lines 60, and is not between one of the first dummy gate lines 60 and the gate line 58. The first dummy gate lines 60 and the second dummy gate lines 68 are both floating. Only the gate line 58 has a voltage applied. The first dummy gate lines 60 and the second dummy gate lines 68 are formed for preventing the loading effect.

Moreover, each of the second dummy gate lines 68 includes a fifth end 168 within the P-type transistor region 52 and a sixth end 268 within the N-type transistor region 54, wherein the third distance $S_3$ is greater than a fifth distance $S_5$ between the fifth end 168 and the first fin structure 56*a*, and the fourth distance $S_4$ is smaller than a sixth distance $S_6$ between the sixth end 268 and the second fin structure 56*b*. Similarly, the fifth end 168 and the sixth end 268 are both encapsulated by the dielectric layer 66. The distance between the ends of the first dummy gate lines 60 and the adjacent fin structure, and the distance between the ends of the second dummy gate lines 68 and the adjacent fin structure influences the stress applied to the P-type transistor 62 and N-type transistor 64. The dummy gate line which is closer to the gate line 58 has a greater influence on the efficiency of the P-type transistor 62 and the N-type transistor 64. That is, the third distance $S_3$ between the third end 160 and the first fin structure 56*a* has more influence on the P-type transistor 62 than the fifth distance $S_5$ between the fifth 168 and the first fin structure 56*a*. Similarly, the fourth distance $S_4$ between the fourth end 260 and the second fin structure 56*b* has more influence on the N-type transistor 64 than the sixth distance $S_6$ between the sixth end 268 and the second fin structure 56*b*. The distance between the end of the first dummy gate line 60 and the first fin structure 56*a*, the distance between the end of the second dummy gate line 68 and the second fin structure 56*b* are decided according to the distance between the first and second dummy gate lines 60/68 and the gate line 58, and the ends of the first and second dummy gate lines 60/68 are close to the N-type transistor 64 or P-type transistor 62. Therefore, the size of the distance between the first end 158 and the first fin structure 56*a*, the distance between the third end 160 and the first fin structure 56*a*, and the distance between the fifth end 168 and the first fin structure 56*a* are ordered as: the first distance $S_1$ is the greatest, the third distance $S_3$ is the second greatest, and the fifth distance $S_5$ is the smallest. The size of the distance between the second end 258 and the second fin structure 56*b*, the distance between the fourth end 260 and the second fin structure 56*b*, and the distance between the sixth end 268 and the second fin structure 56*b* are ordered as: the sixth distance $S_6$ is the greatest, the fourth distance $S_4$ is the second greatest, and the second distance $S_2$ is the smallest.

Figure 9:
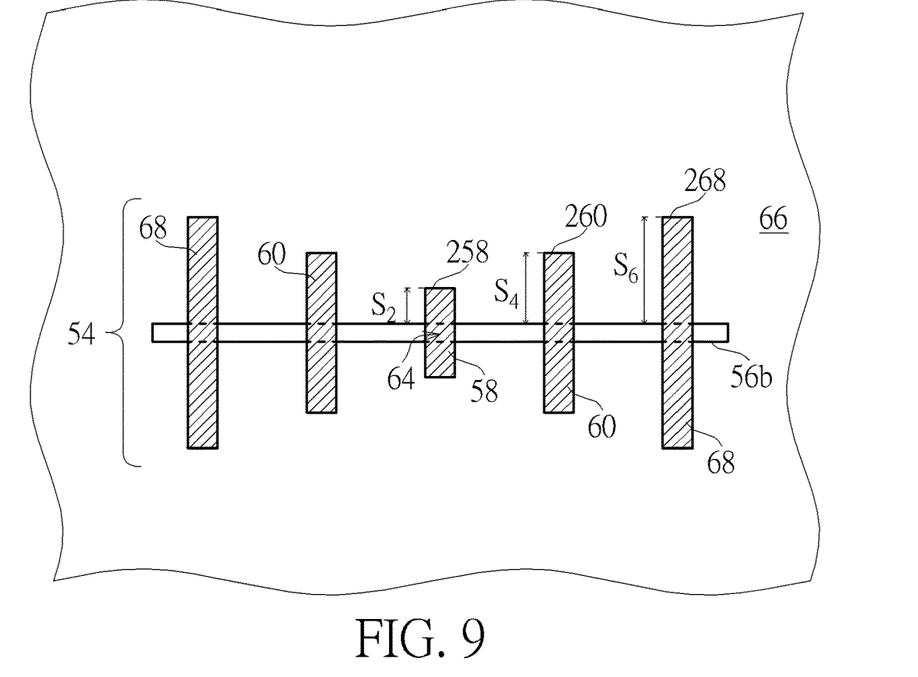
FIG. 9 depicts an N-type transistor structure according to a fifth preferred embodiment of the present invention.

FIG. 9 depict an N-type transistor structure according to a fifth preferred embodiment of the present invention, wherein elements which substantially have the same position and function as those in the fourth preferred embodiment are denoted by the same reference numerals. In contrast to the fourth embodiment, there is only one second fin structure 56*b* disposed within the N-type transistor region 54 and there is no P-type transistor region. The second end 258 of the gate line 58, the fourth end 260 of the first dummy gate line 60 and the sixth end 258 of the second dummy gate line 68 are disposed following the principle in the fourth preferred embodiment, wherein the sixth distance $S_6$ is the greatest, the fourth distance $S_4$ is the second greatest and the second distance $S_2$ is the smallest. Moreover, one end of the gate line 58, one end of the first dummy gate line 60 and one end of the dummy gate line 68 can be arranged by the principle in the fourth preferred embodiment, wherein the other end of the gate line 58, the other end of the first dummy gate line 60 and the other end of the dummy gate line 68 can be aligned with each other. In other embodiments, as shown in FIG. 9, two ends of the gate line 58, two ends of the first dummy gate line 60 and two ends of the dummy gate line 68 are disposed followed the principle of the fourth preferred embodiment. In this way, the N-type transistor structure will have double the efficiency of the N-type transistor structure which has only one end of the first dummy gate line 60 and one end of the dummy gate line 68 arranged by the principle in the fourth preferred embodiment.

Figure 10:
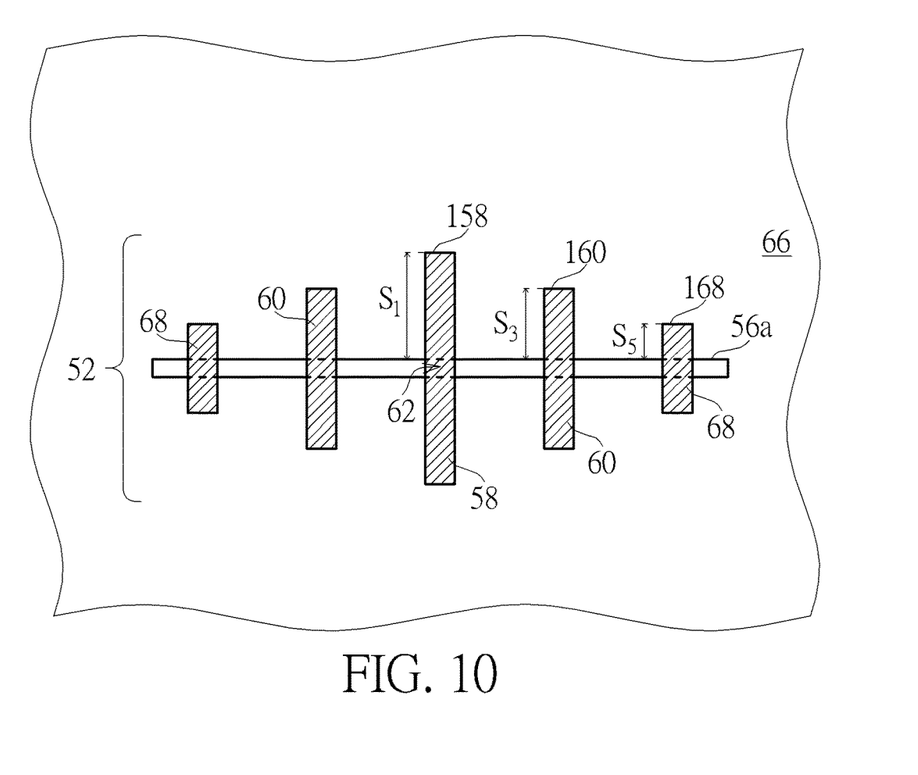
FIG. 10 depicts a P-type transistor structure according to a sixth preferred embodiment of the present invention.

FIG. 10 depicts a P-type transistor structure according to a sixth preferred embodiment of the present invention, wherein elements which substantially have the same position and function as those in the fourth preferred embodiment are denoted by the same reference numerals. In contrast to the fourth embodiment, there is only one first fin structure 56*a* disposed within the P-type transistor region 52 and there is no N-type transistor region. The first end 158 of the gate line 58, the third end 160 of the first dummy gate line 60 and the fifth end 168 of the second dummy gate line 68 are disposed following the principle in the fourth preferred embodiment, wherein the first distance $S_1$ is the greatest, the third distance $S_3$ is the second greatest and the fifth distance $S_5$ is the smallest. One end of the gate line 58, one end of the first dummy gate line 60 and one end of the dummy gate line 68 can be arranged by the principle in the fourth preferred embodiment, wherein the other end of the gate line 58, the other end of the first dummy gate line 60 and the other end of the dummy gate line 68 can be aligned with each other. In other embodiments, as shown in FIG. 10, two ends of the gate line 58, two ends of the first dummy gate line 60 and two ends of the dummy gate line 68 are disposed followed the principle in the fourth preferred embodiment. In this way, the P-type transistor structure has double the efficiency of the P-type transistor structure which has only one end of the first dummy gate line 60 and one end of the dummy gate line 68 arranged by the principle in the fourth preferred embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of adjusting a signal-to-noise ratio (SNR) of a static random access memory (SRAM), comprising:
   providing a substrate, a first long fin structure and a second long fin structure disposed on the substrate, a first short fin structure and a second short fin structure disposed on the substrate and between the first long fin structure and the second long fin structure, a first gate line crossing the first long fin structure, the first short fin structure, and the second long fin structure, and a second gate line crossing the first long fin structure, the second short fin structure and the second long fin structure, wherein the first long fin structure comprises a first side and a second side, the second side faces the first short fin structure, the first side is opposite to the second side, the second long fin structure comprises a third side and a fourth side, the fourth side faces the second short fin structure, and the third side is opposite to the fourth side; and performing a gate line cutting step, comprising:
removing the second gate line between the first long fin structure and the second short fin structure by a first length;
removing the first gate line between the second long fin structure and the first short fin structure by the first length;
removing the first gate line at the first side of the first long fin structure by a second length; and
removing the second gate line at the third side of the second long fin structure by the second length;
wherein an SNR of an SRAM having the first length greater than the second length is greater than an SNR of an SRAM having the first length equal to the second length.

2. The method of adjusting an SNR of an SRAM of claim 1, wherein the first long fin structure, the second long fin structure, the first short fin structure and the second short fin structure are parallel, the first gate line is parallel to the second gate line, and the first gate line is perpendicular to the first long fin structure.

3. The method of adjusting an SNR of an SRAM of claim 1, wherein when performing the gate line cutting step, the second gate line which is removed by the first length is closer to the first long fin structure and farther from the second short fin structure, the first gate line which is removed by the first length is closer to the second long fin structure and farther from the first short fin structure.

4. The method of adjusting an SNR of an SRAM of claim 3, wherein the first short fin structure does not overlap the second gate line, and the second short fin structure does not overlap the first gate line.

5. The method of adjusting an SNR of an SRAM of claim 1, further comprising:

after performing the gate line cutting step, dividing the first gate line into three first gate line segments, and dividing the second gate line into three second gate line segments; and
forming a dielectric layer to encapsulate an end of each of the three first gate line segments, and an end of each of the three second gate line segments.

6. The method of adjusting an SNR of an SRAM of claim 5, wherein an overlapped region of the first long fin structure and one of the first gate line segments forms a first pull-down transistor, an overlapped region of the first long fin structure and one of the second gate line segments forms a first pass gate transistor, an overlapped region of the first short fin structure and one of the first gate line segments forms a first pull-up transistor, an overlapped region of the second short fin structure and one of the second gate line segments forms a second pull-up transistor, an overlapped region of the second long fin structure and one of the first gate line segments forms a second pass gate transistor, and an overlapped region of the second long fin structure and one of the second gate line segments forms a second pull-down transistor.

7. The method of adjusting an SNR of an SRAM of claim 6, wherein the first pull-down transistor, the second pull-down transistor, the first pull-up transistor, the second pull-up transistor, the first pass gate transistor and the second pass gate transistor together form the SRAM.

8. The method of adjusting an SNR of an SRAM of claim 1, wherein the first short fin structure is between the first long fin structure and the second short fin structure.

9. The method of adjusting an SNR of an SRAM of claim 1, wherein the steps of removing the second gate line between the first long fin structure and the second short fin structure by the first length, removing the first gate line between the second long fin structure and the first short fin structure by the first length, removing the first gate line at the first side of the first long fin structure by the second length, and removing the second gate line at the third side of the second long fin structure by the second length are performed simultaneously.

* * * * *